United States Patent [19]

Cho

[11] Patent Number: 5,712,577
[45] Date of Patent: Jan. 27, 1998

[54] ANTI-FUSE PROGRAMMING CIRCUIT FOR USER PROGRAMMABLE INTEGRATED

[75] Inventor: Hanjin Cho, Yuchon-Dong, Rep. of Korea

[73] Assignee: Electronics and Telecommunications Research Institute, Daejeon, Rep. of Korea

[21] Appl. No.: 634,702

[22] Filed: Apr. 18, 1996

[51] Int. Cl.$^6$ .................................. H03K 19/177
[52] U.S. Cl. .................... 326/38; 326/41; 327/525
[58] Field of Search ................. 326/38–39, 41; 327/525

[56] References Cited

U.S. PATENT DOCUMENTS

| | | | |
|---|---|---|---|
| 4,910,417 | 3/1990 | Gamal et al. | 307/465 |
| 5,194,759 | 3/1993 | El-Ayat et al. | 327/525 |
| 5,304,871 | 4/1994 | Dharmarajan et al. | |
| 5,347,519 | 9/1994 | Cooke et al. | 371/22.2 |
| 5,448,187 | 9/1995 | Kowalski | 327/525 |
| 5,469,077 | 11/1995 | Cox | 326/38 |
| 5,469,109 | 11/1995 | Paivinen | 327/525 |
| 5,477,167 | 12/1995 | Chua | 326/41 |
| 5,495,181 | 2/1996 | Kolze | 326/38 |
| 5,498,978 | 3/1996 | Takahashi et al. | 326/38 |
| 5,498,979 | 3/1996 | Parlour et al. | 327/525 X |
| 5,534,793 | 7/1996 | Nasserbakht | 327/525 X |
| 5,552,720 | 9/1996 | Lulla et al. | 326/38 |
| 5,566,107 | 10/1996 | Gilliam | 327/525 X |

*Primary Examiner*—David R. Hudspeth
*Attorney, Agent, or Firm*—Antonelli, Terry, Stout & Kraus, LLP

[57] ABSTRACT

An anti-fuse programming circuit for a user programmable integrated circuit which is capable of programming an anti-fuse at the point where a vertical track and a horizontal track cross each other. PMOS transistors are used to selectively supply a program voltage, and half the program voltage to the vertical track and NMOS transistors are used to selectively supply the program voltage and a ground voltage to the horizontal track. According to the present invention, only a voltage approximated to half the program voltage is applied between gate terminals and bulks of transistors used to select program row and column and to supply the program voltage. Therefore, the present transistors can be prevented from breaking down, by enduring only half of a voltage which conventional transistors must endure.

4 Claims, 6 Drawing Sheets

1

ANTI-FUSE PROGRAMMING CIRCUIT FOR USER PROGRAMMABLE INTEGRATED

BACKGROUND OF THE INVENTION

1. Field of the Invention

The present invention relates in general to anti-fuse programming circuits for user programmable integrated circuits, and more particularly, to a circuit for preventing program transistors from breaking down due to the supply of a high program voltage.

2. Description of the Prior Art

User programmable integrated circuits have been used in logic arrays for the design of digital and analog systems. In detail, a plurality of logic cells or matrix modules is interconnected by vertical and horizontal channels. A desired logic array is programmed by shorting or opening the switch devices in the vertical and horizontal channels.

As such a user programmable integrated circuit, a programmable read only memory (PROM) or a programmable logic device (PLD) has been used. Recently, a field programmable gate array (referred to hereinafter as FPGA) employing an anti-fuse has frequently been used as such a user programmable integrated circuit.

The prior art related with a user programmable integrated circuit is as follows:

1. U.S. Pat. No. 4,910,417 entitled "Universal logic module comprising multiflexers"
2. U.S. Pat. No. 5,347,519 entitled "Preprogramming testing in a field programmable gate array"
3. U.S. Pat. No. 5,304,871 entitled "Programmable interconnect architecture employing leaky programmable elements".

Very large-scale integrated circuits (referred to hereinafter as VLSI circuits) have a tendency to require a high integration degree and a low supply voltage. However, in the VLSI circuits, a high voltage is supplied as a program voltage for programming a logic array desired by the user. In other words, a programming circuit designed in such a VLSI circuit is supplied with a voltage higher than that supplied to general logic arrays, thereby shorting or opening switch devices to design a desired logic array.

MOS transistors, an erasable and programmable read only memory((E)ERPOM), and an anti-fuse are used as switch devices for such vertical and horizontal channels. The anti-fuse has superior short/open characteristics to those of other switch devices.

When the anti-fuse is programmed (or shorted), it has a short resistance of 50–500 ohm, which is much lower than that of the transistor. The anti-fuse also has a small size. As a result, the anti-fuse has frequently been used as a switch device for highly integrated, high-speed FPGAs.

The anti-fuse is operated in the opposite manner to general fuses. Namely, the anti-fuse is shorted when it is applied with a constant voltage at both of its sides. Such a program voltage has a value within the range of 7 to 18V, which is determined according to the characteristics of anti-fuses.

FIG. 1 shows a conventional circuit for programming one anti-fuse in a user programmable integrated circuit such as an FPGA VLSI circuit. As shown in FIG. 1, the FPGA VLSI circuit comprises an anti-fuse A1 in its chip, which exists as a connection channel at the point where a vertical track VT and a horizontal track HT cross each other. A program voltage is applied to the vertical and horizontal tracks VT and HT to program the anti-fuse A1.

In series connected to the vertical track VT are a vertical voltage supply circuit B1 and NMOS transistors M1 and M2. The NMOS transistor M1 acts to select a program column and the NMOS transistor M2 acts to determine a horizontal track in the program column selected by the NMOS transistor M1.

On the other hand, in series connected to the horizontal track HT are a horizontal voltage supply circuit B4 and NMOS transistors M3 and M4. The NMOS transistor M3 acts to select a program row and the NMOS transistor M4 acts to determine a vertical track in the program row selected by the NMOS transistor M3.

The NMOS transistor M1 has its gate terminal connected to a vertical voltage supply circuit B2 and the NMOS transistor M2 has its gate terminal connected to a vertical voltage supply circuit B3. The NMOS transistor M3 has its gate terminal connected to a horizontal voltage supply circuit B5 and the NMOS transistor M4 has its gate terminal connected to a horizontal voltage supply circuit B6.

The vertical voltage supply circuits B1–B3 and the horizontal voltage supply circuits B4–B6 act to supply a maximum program voltage VPP and a minimum program voltage GND to the NMOS transistors M1–M4.

The NMOS transistors M1–M4 have their bulks connected in common to a ground voltage source GND.

FIG. 2 is a circuit diagram of each of the vertical voltage supply circuits B1–B3 and horizontal voltage supply circuits B4–B6 in FIG. 1. As shown in this drawing, the voltage supply circuit includes a PMOS transistor PM11 and an NMOS transistor NM11 connected in series between a source of a program voltage VPP and a source of a ground voltage GND. The PMOS transistor PM11 has its gate terminal connected to the ground voltage source GND and the NMOS transistor NM11 has its gate terminal connected to an input terminal INPUT for inputting an anti-fuse programming control signal.

The voltage supply circuit further includes a PMOS transistor PM12 and an NMOS transistor NM12 connected in series between the program voltage source VPP and the ground voltage source GND. The PMOS transistor PM12 and the NMOS transistor NM12 have their gate terminals connected in common to a common connection node nd1 of drain terminals of the PMOS transistor PM11 and NMOS transistor NM11. A common connection node of drain terminals of the PMOS transistor PM12 and NMOS transistor NM12 is connected to an output terminal OUTPUT of the voltage supply circuit. The output terminal OUTPUT is connected to each of the NMOS transistors M1–M4 in FIG. 1.

The operation of the conventional anti-fuse programming circuit for the FPGA VLSI circuit with the above-mentioned construction will hereinafter be described.

When the program voltage VPP is applied to the vertical track VT and the ground voltage GND is applied to the horizontal track HT, the anti-fuse A1 is shorted to be programmed. However, the voltages to the vertical and horizontal tracks VT and HT may be changed with each other so that the anti-fuse A1 can be shorted to be programmed.

On the other hand, a low logic signal is applied to the input terminal INPUT to allow a voltage at the output terminal OUTPUT to have the ground voltage level GND. As a result, the NMOS transistor NM11 is turned off, thereby causing the common connection node nd1 to have the program voltage level VPP. Then, the PMOS transistor PM11 is turned off and the NMOS transistor NM12 is turned on. As a result, the voltage at the output terminal OUTPUT becomes the ground voltage state GND and the program voltage VPP is applied between the drain terminal and source terminal of the PMOS transistor PM12.

Provided that the program voltage VPP is higher than a breakdown voltage of the PMOS transistor PM12, the PMOS transistor PM12 will break down. Similarly, if the program voltage VPP is higher than breakdown voltages of the NMOS transistors M1–M4 in FIG. 1 and the PMOS and NMOS transistors PM11, PM12, NM11 and NM12 in FIG. 2, those transistors will break down.

As the process of integrated circuits is developed and the available voltage becomes lower, the transistor has a thinner insulating film, a shorter source-drain distance and a higher diffusion concentration. According to such a trend, the transistor has a lower breakdown voltage between its gate terminal and bulk and between its source terminal and drain.

For example, the transistor has a breakdown voltage of about 10V in the process of 0.8 μm. For this reason, when a high anti-fuse programming voltage of, for example, 18V is supplied to the anti-fuse through a transistor manufactured by the general transistor manufacturing method, the transistor breaks down because the program voltage of 18V higher than the breakdown voltage of about 10V is applied between the source terminal and drain terminal thereof.

In order to avoid such a problem, the anti-fuse programming transistor must have a thicker insulating film between its gate terminal and bulk and a longer source-drain distance.

However, for the purpose of adjusting the thickness of the insulating film between the gate terminal and bulk of the anti-fuse programming transistor, a separate mask and the attendant additional process steps are required to discriminate the anti-fuse programming transistor from other general transistors in the integrated circuit. Such a requirement results in a reduction in process yield.

Further, the size of transistor is increased in proportion to the source-drain distance thereof being lengthened. For this reason, lengthening the source-drain distance of transistor is not preferred in view of the efficient utilization of silicon area. Moreover, it is not economical.

SUMMARY OF THE INVENTION

Therefore, the present invention has been made in view of the above problem, and it is an object of the present invention to provide an anti-fuse programming circuit for a user programmable integrated circuit which is capable of preventing program transistors from breaking down due to the supply of a high program voltage.

In accordance with the present invention, program transistors used to supply a high voltage are manufactured through the general CMOS process similarly to transistors of different logic circuits in the integrated circuit. Vertical and horizontal track voltage supply parts undertake partial responsibilities for a program voltage to prevent the breakdown of the program transistors.

A vertical voltage supply circuit is adapted to generate the program voltage or half the program voltage as its output voltage. First and second PMOS transistors supply the program voltage to a vertical track in response to the output voltage from the vertical voltage supply circuit. The first PMOS transistor selects a column of the vertical track and the second PMOS transistor selects a row of the vertical track. A horizontal voltage supply circuit is adapted to generate half the program voltage or a ground voltage as its output voltage. First and second NMOS transistors supply the program voltage to a horizontal track in response to the output voltage from the horizontal voltage supply circuit. The first NMOS transistor selects a row of the horizontal track and the second NMOS transistor selects a column of the horizontal track. The vertical and horizontal tracks cross each other at an anti-fuse.

The vertical voltage supply circuit is provided with two-stage inverter circuits, input stage and output stage inverter circuits, each of which includes a PMOS transistor and an NMOS transistor connected in series. The input stage inverter circuit is adapted to invert an anti-fuse programming control signal. A source of a first voltage and a source of the ground voltage are connected respectively to source terminals of the PMOS and NMOS transistors in the input stage inverter circuit. The output stage inverter circuit is adapted to invert an output signal from the input stage inverter circuit and to supply the inverted signal as its output signal. A source of the program voltage and a source of a second voltage are connected respectively to source terminals of the PMOS and NMOS transistors in the output stage inverter circuit.

The first voltage is higher than the half program voltage and lower than the program voltage. The second voltage is higher than the ground voltage and lower than the half program voltage. Further, the first voltage is lower than breakdown voltages of transistors.

Similarly to the vertical voltage supply circuit, the horizontal voltage supply circuit is provided with two-stage inverter circuits, input stage and output stage inverter circuits, each of which includes a PMOS transistor and an NMOS transistor connected in series. However, a source of the half program voltage and the ground voltage source are connected respectively to source terminals of the PMOS and NMOS transistors in the input stage inverter circuit. Similarly, the half program voltage source and the ground voltage source are connected respectively to source terminals of the PMOS and NMOS transistors in the output stage inverter circuit.

The vertical voltage supply circuit supplies half the program voltage if the anti-fuse programming control signal is low in logic and supplies the program voltage if the anti-fuse programming control signal is high in logic. The horizontal voltage supply circuit supplies the ground voltage if the anti-fuse programming control signal is low in logic and supplies the half program voltage if the anti-fuse programming control signal is high in logic.

When the vertical voltage supply circuit supplies the program voltage and the horizontal voltage supply circuit supplies the ground voltage, the program voltage is applied to the vertical track and the ground voltage is applied to the horizontal track, thereby shorting the anti-fuse.

The PMOS and NMOS transistors in the horizontal voltage supply circuit and the first and second NMOS transistors for the selection of the horizontal track endure the voltage range between the half program voltage and the ground voltage. The PMOS and NMOS transistors in the vertical voltage supply circuit and the first and second PMOS transistors for the selection of the horizontal track endure the voltage range between the program voltage and the half program voltage.

Therefore, the present transistors can be prevented from breaking down, by enduring only half of a voltage which conventional transistors must endure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
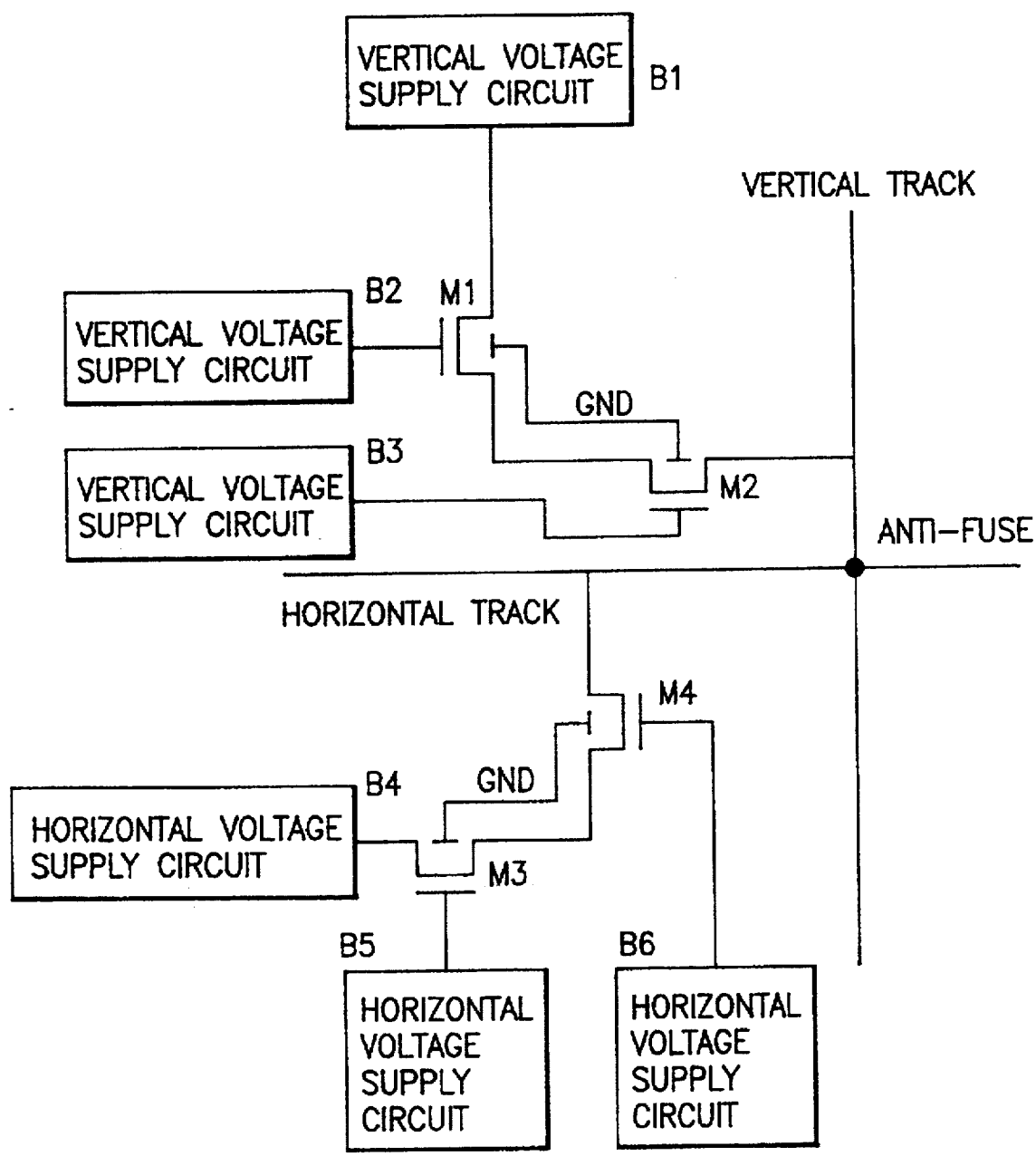
FIG. 1 is a circuit diagram of a conventional anti-fuse programming circuit for a user programmable integrated circuit.
Figure 2:
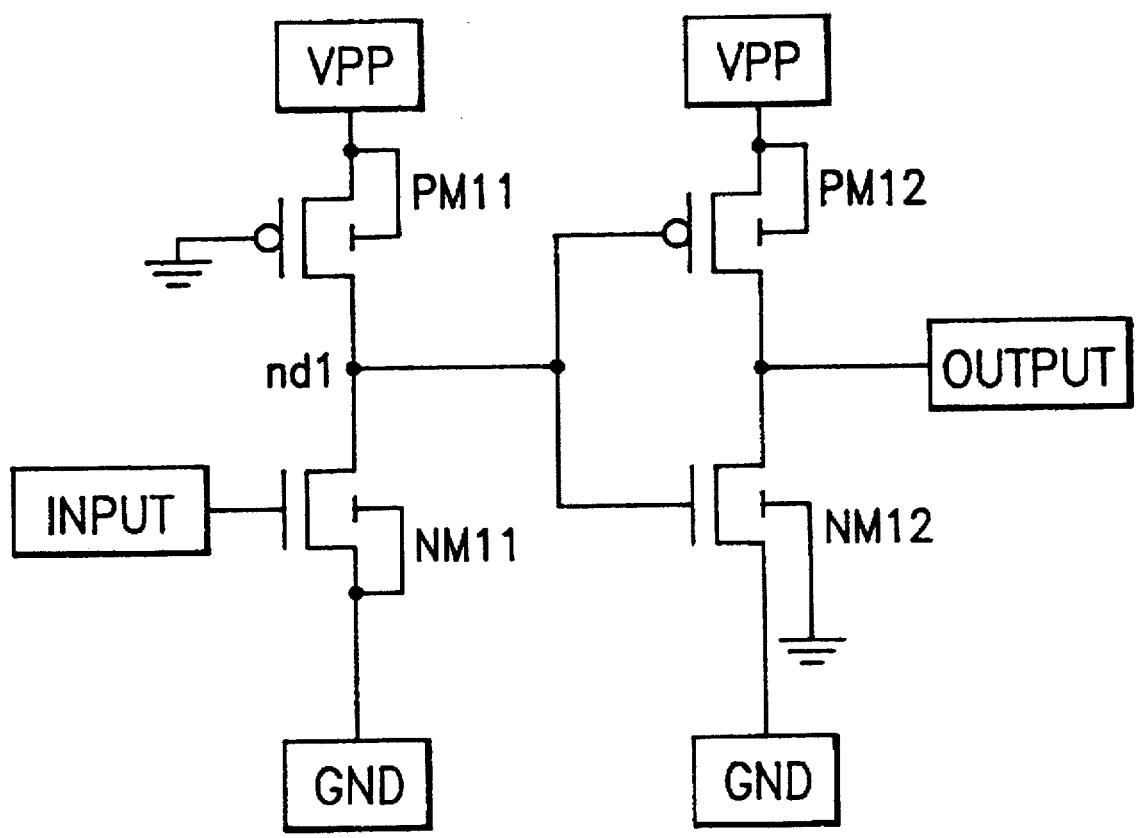
FIG. 2 is a circuit diagram of a voltage supply circuit in FIG. 1.
Figure 3:
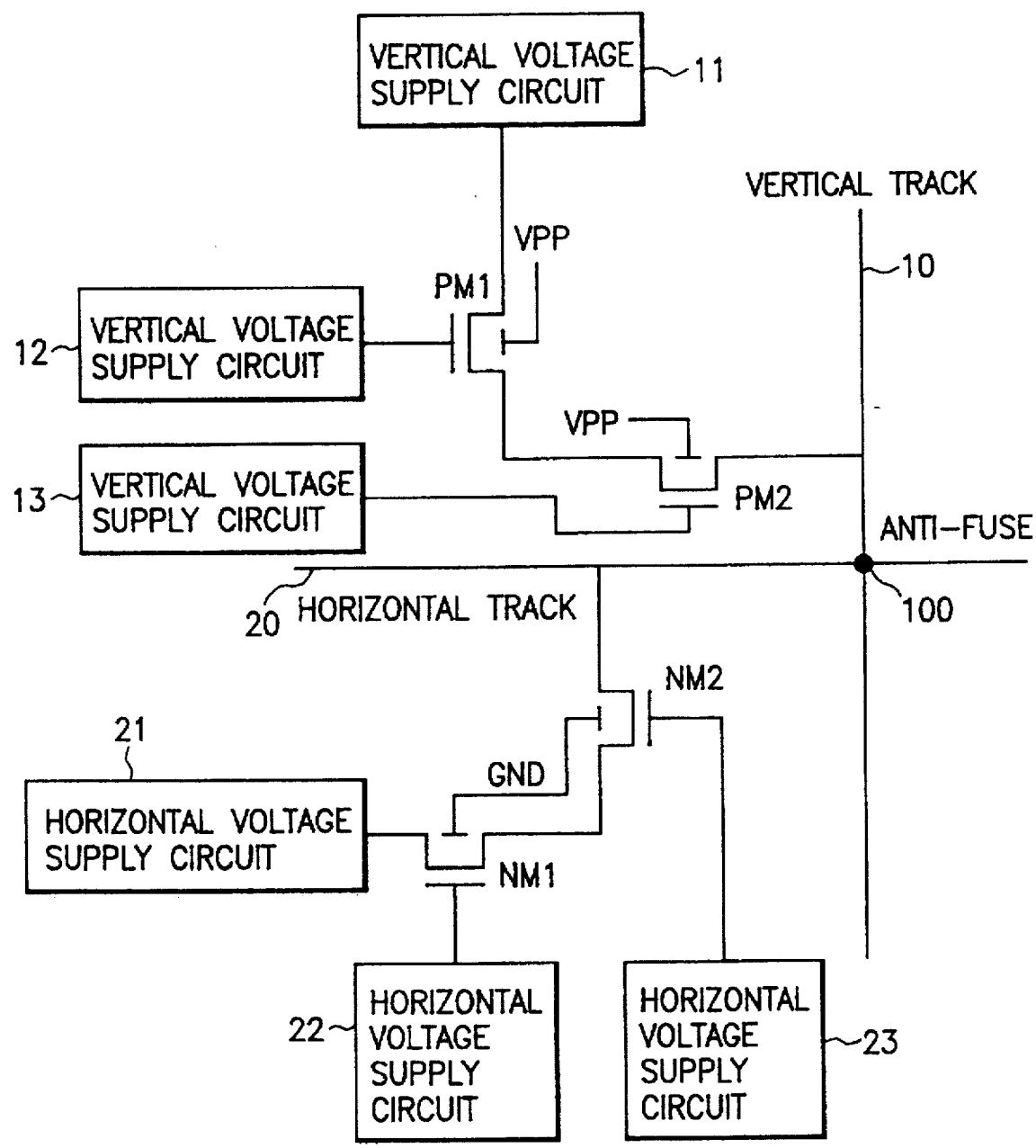
FIG. 3 is a circuit diagram of an anti-fuse programming circuit for a user programmable integrated circuit in accordance with the present invention.

Referring to FIG. 3, there is shown a circuit diagram of an anti-fuse programming circuit for a user programmable integrated circuit such as an FPGA VLSI circuit in accordance with the present invention. The anti-fuse programming circuit is adapted to program one anti-fuse 100 at the point where a vertical track 10 and a horizontal track 20 cross each other.

As shown in FIG. 3, in series connected to the vertical track 10 are a first vertical voltage supply circuit 11 and first and second PMOS transistors PM1 and PM2. The first PMOS transistor PM1 acts to select a program column and the second PMOS transistor PM2 acts to determine a row in the program column selected by the first PMOS transistor PM1.

On the other hand, in series connected to the horizontal track 20 are a first horizontal voltage supply circuit 21 and first and second NMOS transistors NM1 and NM2. The first NMOS transistor NM1 acts to select a program row and the second NMOS transistor NM2 acts to determine a column in the program row selected by the first NMOS transistor NM1.

The first PMOS transistor PM1 has its gate terminal connected to a second vertical voltage supply circuit 12 and the second PMOS transistor PM2 has its gate terminal connected to a third vertical voltage supply circuit 13. The first NMOS transistor NM1 has its gate terminal connected to a second horizontal voltage supply circuit 22 and the second NMOS transistor NM2 has its gate terminal connected to a third horizontal voltage supply circuit 23.

Figure 4A:
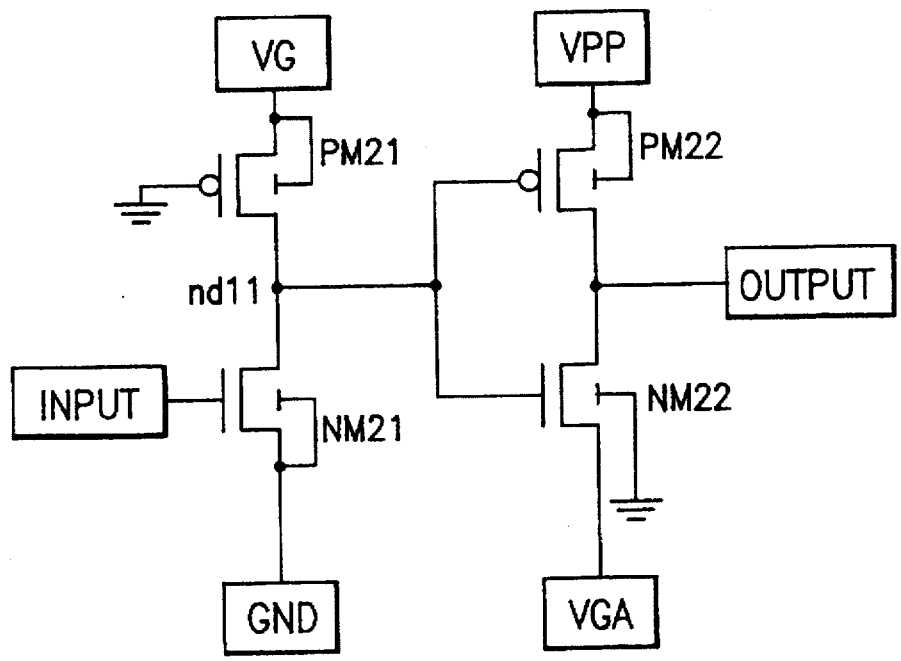
FIG. 4A is a circuit diagram of a vertical voltage supply circuit in FIG. 3.

FIG. 4A is a circuit diagram of each of the first to third horizontal voltage supply circuits 21-23 in FIG. 3. The second and third horizontal voltage supply circuits 22 and 23 are the same in construction as the first horizontal voltage supply circuit 21. But, transistors in the second and third horizontal voltage supply circuits 22 and 23 may be different in size from those in the first horizontal voltage supply circuit 21 according to the applications.

As shown in FIG. 4A, the horizontal voltage supply circuit is provided with two-stage inverter circuits, input stage and output stage inverter circuits, each of which includes a PMOS transistor and an NMOS transistor connected in series. The input stage inverter circuit includes a PMOS transistor PM21 and an NMOS transistor NM21 connected in series between a source of a voltage VG and a source of a ground voltage GND. The PMOS transistor PM21 has its gate terminal connected to the ground voltage source GND and the NMOS transistor NM21 has its gate terminal connected to an input terminal INPUT for inputting a horizontal track selection signal. The output stage inverter circuit includes a PMOS transistor PM22 and an NMOS transistor NM22 connected in series between a source of a program voltage VPP and a source of a voltage VGA. The PMOS transistor PM22 and the NMOS transistor NM22 have their gate terminals connected in common to a common connection node nd11 of drain terminals of the PMOS transistor PM21 and NMOS transistor NM21 in the input stage inverter circuit. A common connection node of drain terminals of the PMOS transistor PM22 and NMOS transistor NM22 in the output stage inverter circuit is connected to an output terminal OUTPUT of the horizontal voltage supply circuit.

Further, the voltage VG is higher than half the program voltage VPP/2 and lower than the program voltage VPP. The voltage VGA is higher than the ground voltage GND and lower than the half program voltage VPP/2. Further still, the voltage VG is lower than breakdown voltages of transistors.

Figure 4B:
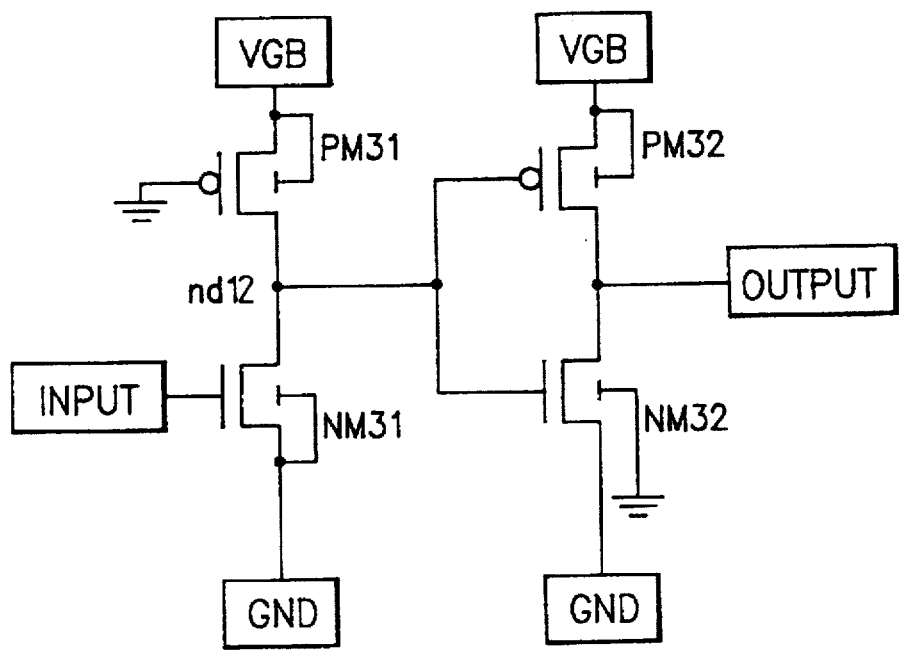
FIG. 4B is a circuit diagram of a horizontal voltage supply circuit in FIG. 3.

FIG. 4B is a circuit diagram of each of the first to third vertical voltage supply circuits 11-13 in FIG. 3. The second and third vertical voltage supply circuits 12 and 13 are the same in construction as the first vertical voltage supply circuit 11. But, transistors in the second and third vertical voltage supply circuits 12 and 13 may be different in size from those in the first vertical voltage supply circuit 11 according to applications.

As shown in FIG. 4B, similarly as the horizontal voltage supply circuit in FIG. 4A, the vertical voltage supply circuit is provided with two-stage inverter circuits, input stage and output stage inverter circuits, each of which includes a PMOS transistor and an NMOS transistor connected in series. However, in the vertical voltage supply circuit, a source of a voltage VGB is connected to the source terminals of the PMOS transistors in the two-stage inverter circuits and the ground voltage source GND is connected to the source terminals of the NMOS transistors therein. Here, the voltage VGB is the same as the half program voltage VPP/2.

The input stage inverter circuit includes a PMOS transistor PM31 and an NMOS transistor NM31 connected in series between the voltage source VGB and the ground voltage source GND. The PMOS transistor PM31 has its gate terminal connected to the ground voltage source GND and the NMOS transistor NM31 has its gate terminal connected to an input terminal INPUT for inputting a vertical track selection signal. The output stage inverter circuit includes a PMOS transistor PM32 and an NMOS transistor NM32 connected in series between the voltage source VGB and the ground voltage source GND. The PMOS transistor PM32 and the NMOS transistor NM32 have their gate terminals connected in common to a common connection node nd12 of drain terminals of the PMOS transistor PM31 and NMOS transistor NM31 in the input stage inverter circuit. A common connection node of drain terminals of the PMOS transistor PM32 and NMOS transistor NM32 in the output stage inverter circuit is connected to an output terminal OUTPUT of the vertical voltage supply circuit. The PMOS transistors PM31 and PM32 have their bulks connected in common to the voltage source VGB and the NMOS transistors NM31 and NM32 have their bulks connected in common to the ground voltage source GND. Here, the voltage VGB is the same as the half program voltage VPP/2.

The operation of the anti-fuse programming circuit for the FPGA VLSI circuit with the above-mentioned construction in accordance with the present invention will hereinafter be described in detail.

In the vertical voltage supply circuit of FIG. 4A, the NMOS transistor NM21 is opened when a low logic signal is applied to the input terminal INPUT. In this case, the common connection node nd11 becomes the voltage state VG. Because the voltage VG is lower than the program voltage VPP, the PMOS transistor PM22 is turned on. Also, the NMOS transistor NM22 is turned on because the voltage VGA is lower than the voltage VG. As a result, a voltage approximated to the voltage VGA is induced at the output terminal OUTPUT by making the size of the NMOS transistor NM22 large.

On the other hand, when a high logic signal is applied to the input terminal INPUT, the NMOS transistor NM21 is turned on, thereby causing a voltage to be induced at the common connection node nd11 according to the sizes of the PMOS and NMOS transistors PM21 and NM21. At this time, the induced voltage has a level between the voltages VG and GND. If the induced voltage has a level approximated to the voltage VGA by adjusting the sizes of the PMOS and NMOS transistors PM21 and NM21, the PMOS transistor PM22 is turned on and the NMOS transistor NM22 is opened, thereby causing the program voltage VPP to be induced at the output terminal OUTPUT.

At this time, the voltage source VGA connected to the NMOS transistor NM22 has a level approximated to the half program voltage VPP/2 and the voltage source VG connected to the PMOS transistor PM21 has a level higher than the half program voltage VPP/2 and lower than the program voltage VPP. As a result, the maximum applicable voltage to the PMOS transistor PM21 is the voltage VG between the gate terminal and bulk thereof. Provided that the voltage VG is lower than the breakdown voltages of transistors, the transistors will be prevented from breaking down.

The horizontal voltage supply circuit of FIG. 4B supplies the half program voltage VPP/2 as the maximum voltage and the ground voltage GND as the minimum voltage. The ground voltage GND appears at the output terminal OUTPUT if the input terminal INPUT is low in logic and the voltage VGB appears at the output terminal OUTPUT if the input terminal INPUT is high in logic. The maximum applicable voltage to the transistors in this circuit is the half program voltage VPP/2. Therefore, the transistors can be prevented from breaking down.

By the way, the input signals to the input terminals INPUT are controlled in such a manner that the vertical voltage supply circuit supplies the program voltage VPP and the horizontal voltage supply circuit supplies the ground voltage GND to short the anti-fuse 100. As a result, with the horizontal track 10 supplied with the ground voltage GND and the vertical track 20 supplied with the program voltage VPP, the anti-fuse 100 is shorted to be programmed. As mentioned above, the vertical voltage supply circuit supplies the program voltage VPP as the maximum voltage and the voltage VGA as the minimum voltage to prevent the transistors from breaking down. Also, the horizontal voltage supply circuit supplies the half program voltage VGB (VPP/2) as the maximum voltage and the ground voltage GND as the minimum voltage to prevent the transistors from breaking down. Namely, in accordance with the present invention, the transistors can be prevented from breaking down, by enduring only half of a voltage which conventional transistors must endure.

Figure 5:
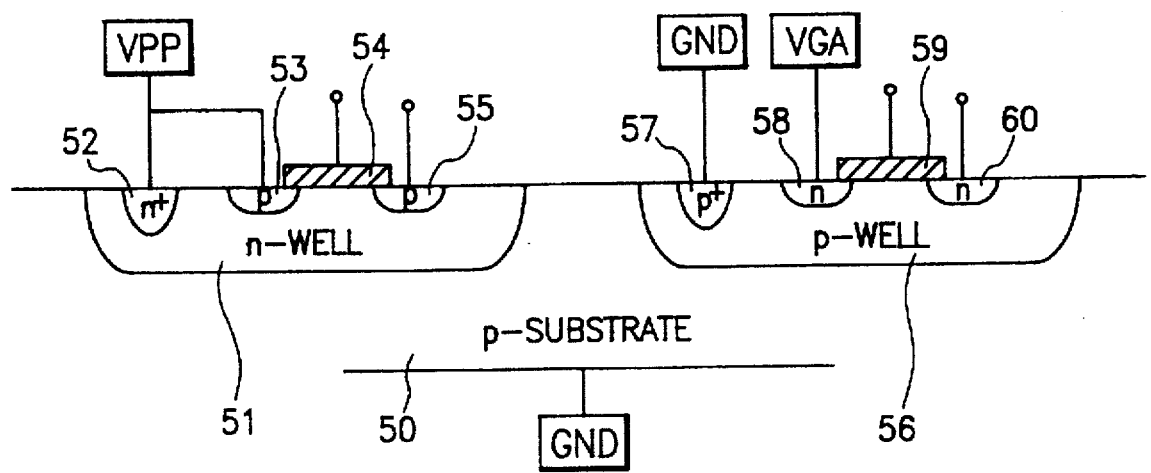
FIG. 5 is a sectional view illustrating the construction of transistors in FIG. 4A.

FIG. 5 is a sectional view illustrating the construction of the PMOS and NMOS transistors PM22 and NM22 in the vertical voltage supply circuit of FIG. 4A. As shown in this drawing, a p-type substrate 50 is connected to the ground voltage source GND. The PMOS transistor PM22 has its bulk 52 and source terminal 53 connected in common to the program voltage source VPP. The PMOS transistor PM22 also has its drain terminal 55 connected to the output terminal OUTPUT of the vertical voltage supply circuit. The NMOS transistor NM22 has its bulk 57 connected to the ground voltage source GND, its source terminal 58 connected to the voltage source VGA and its drain terminal 60 connected to the output terminal OUTPUT of the vertical voltage supply circuit. Here, the reference numeral 54 designates the gate terminal of the PMOS transistor PM22 and the reference numeral 59 designates the gate terminal of the NMOS transistor NM22.

Noticeably, the electric potential of an n-type well 51 is the program voltage VPP in the programming circuit, whereas a supply voltage VDD in the logic circuit. For this reason, a reverse voltage is applied between the p-type substrate 50 and the n-type well 51, thereby preventing a loss of current flowing from the n-type well 51 to the p-type substrate 50.

Further, the reverse voltage VGA is applied between the n-type diffusion region 58 and a p-type well 56, thereby preventing a loss of current flowing through the transistor.

Figure 6:
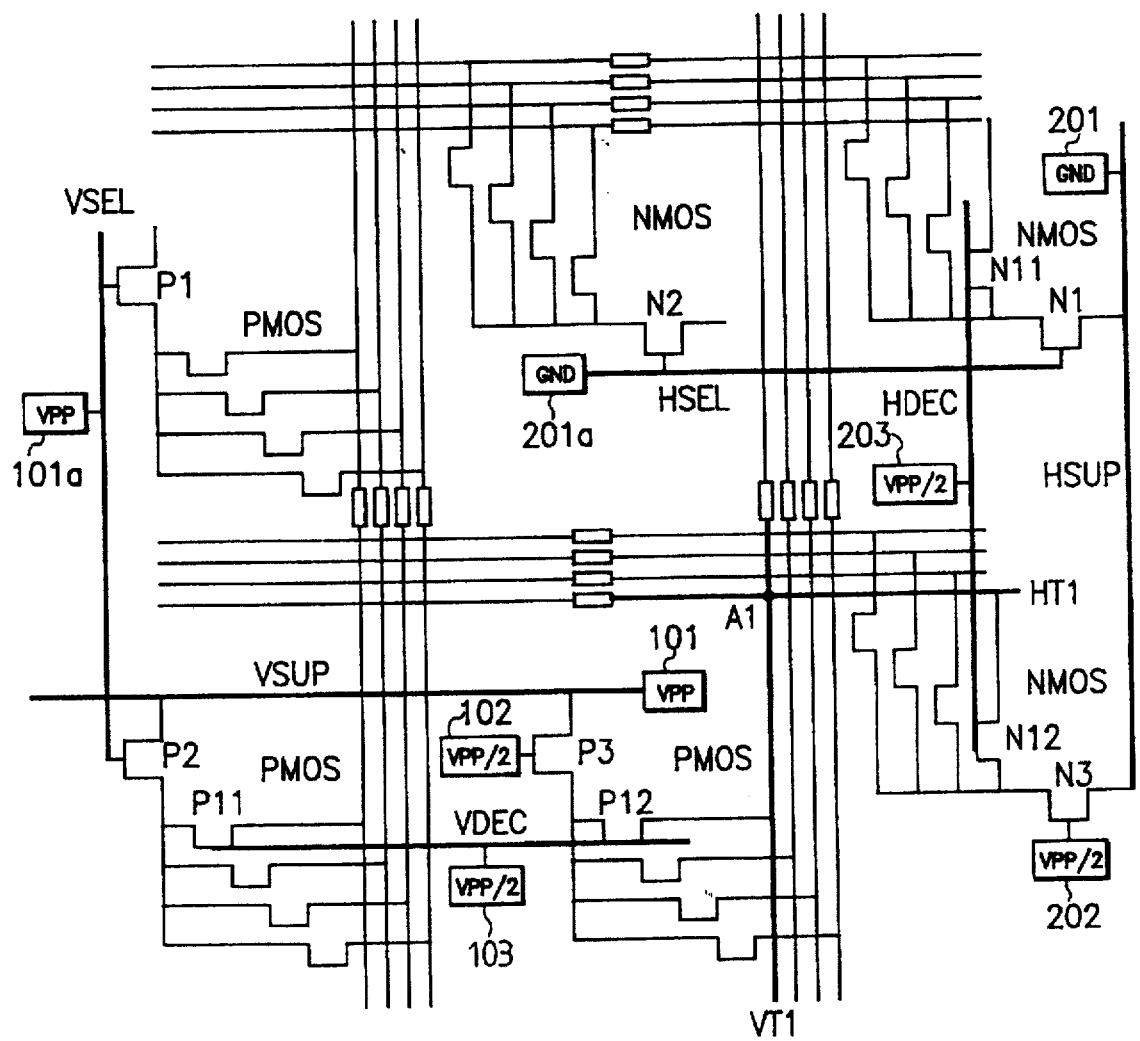
FIG. 6 is a circuit diagram illustrating the arrangement of program transistors used to program a plurality of anti-fuses in accordance with the present invention.

FIG. 6 is a circuit diagram illustrating the arrangement of program transistors used to program a plurality of anti-fuses in accordance with the present invention.

An anti-fuse A1 can be programmed by applying a program voltage between a horizontal track HT1 and a vertical track VT1.

As a result, a voltage supply line VSUP to the vertical track VT1 is connected to a source 101 of the program voltage VPP and a voltage supply line HSUP to the horizontal track HT1 is connected to a source 201 of the ground voltage GND.

In order to pass the program voltage VPP from the program voltage source 101 to the vertical track VT1, the half program voltages VPP/2 from half program voltage sources 102 and 103 must be applied to gate terminals of transistors P3 and P12, respectively, to turn them on.

Similarly, a transistor P11 is turned on because its gate terminal is connected to the gate terminal of the transistor P12 as shown in FIG. 6. Such conduction of the transistor P11 can be avoided by applying the program voltage VPP from a program voltage source 101a to a column selection line VSEL connected to a gate terminal of a transistor P2.

In order to pass the ground voltage GND from the ground voltage source 201 to the horizontal track HT1, the half program voltages VPP/2 from half program voltage sources 202 and 203 must be applied to gate terminals of transistors N3 and N12, respectively, to turn them on.

At this time, a transistor N11 is turned on because its gate terminal is connected to the gate terminal of the transistor N12 as shown in FIG. 6. Such conduction of the transistor N11 can be avoided by applying the ground voltage GND from a ground voltage source 201a to a row selection line HSEL connected to a gate terminal of a transistor N1.

The anti-fuse A1 is programmed in the above-mentioned manner. Similarly, other anti-fuses can be programmed in the same manner as the anti-fuse A1.

As apparent from the above description, according to the present invention, the anti-fuse programming circuit can prevent the breakdown of the program transistors in the user programmable integrated circuit. Further, the program transistors can be manufactured through the general CMOS process similarly to transistors of different logic circuits in the integrated circuit. Therefore, additional process steps are not required, resulting in an increase in process yield.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An anti-fuse programming circuit for a user programmable integrated circuit, comprising:

horizontal track voltage supply means for selectively supplying half a program voltage and a ground voltage to a horizontal track to program an anti-fuse at which said vertical track and a horizontal track cross each other; and vertical track voltage supply means for selectively supplying the program voltage and the half program voltage to said vertical track to program said anti-fuse;

whereby transistors used to program said anti-fuse are prevented from breaking down.

2. An anti-fuse programming circuit for a user programmable integrated circuit as set forth in claim 1, wherein said vertical track voltage supply means includes:

first to third vertical voltage supply circuits, each of said first to third vertical voltage supply circuits supplying the program voltage or half the voltage in response to a corresponding one of first to third anti-fuse programming control signals;

a first PMOS transistor for selecting a column of said vertical track, said first PMOS transistor having its source terminal connected to said first vertical voltage supply circuit and its gate terminal connected to said second vertical voltage supply circuit; and a second PMOS transistor for selecting a row of said vertical track, said second PMOS transistor having its source terminal connected to a drain terminal of said first PMOS transistor, its gate terminal connected to said third vertical voltage supply circuit and its drain terminal connected to said vertical track; and wherein said horizontal track voltage supply means includes:

first to third horizontal voltage supply circuits, each of said first to third horizontal voltage supply circuits supplying half the program voltage or the ground voltage in response to a corresponding one of fourth to sixth anti-fuse programming control signals, a first NMOS transistor for selecting a row of said horizontal track, said first NMOS transistor having its drain terminal connected to said first horizontal voltage supply circuit and its gate terminal connected to said second horizontal voltage supply circuit, and a second NMOS transistor for selecting a column of said horizontal track, said second NMOS transistor having its drain terminal connected to a source terminal of said first NMOS transistor, its gate terminal connected to said third horizontal voltage supply circuit and its drain terminal connected to said horizontal track.

3. An anti-fuse programming circuit for a user programmable integrated circuit as set forth in claim 2, wherein each of said first to third vertical voltage supply circuits includes:

a third PMOS transistor having its source terminal and bulk connected in common to a source of a first voltage and its gate terminal connected to a source of the ground voltage, the first voltage being lower than the program voltage, higher than the half program voltage and lower than breakdown voltages of all transistors in the anti-fuse programming circuit;

a third NMOS transistor having its drain terminal connected to a drain terminal of said third PMOS transistor, its gate terminal for inputting the corresponding anti-fuse programming control signal and its source terminal and bulk connected in common to said ground voltage source;

a fourth PMOS transistor having its source terminal and bulk connected in common to a source of the program voltage and its gate terminal connected to a common connection node of the drain terminals of said third PMOS transistor and third NMOS transistor; and a fourth NMOS transistor having its drain terminal connected to a drain terminal of said fourth PMOS transistor, its gate terminal connected to said common connection node, its bulk connected to said ground voltage source and its source terminal connected to a source of a second voltage, said drain terminals of said fourth PMOS transistor and fourth NMOS transistor being connected in common to an output terminal of said horizontal voltage supply circuit, the second voltage being lower than the half supply voltage and higher than the ground voltage; and wherein said first to third vertical voltage supply circuits have the same construction.

4. An anti-fuse programming circuit for a user programmable integrated circuit as set forth in claim 2, wherein each of said first to third horizontal voltage supply circuits includes:

a third PMOS transistor having its source terminal and bulk connected in common to a source of the half supply voltage and its gate terminal connected to a source of the ground voltage;

a third NMOS transistor having its drain terminal connected to a drain terminal of said third PMOS transistor, its gate terminal for inputting the corresponding anti-fuse programming control signal and its source terminal and bulk connected in common to said ground voltage source;

a fourth PMOS transistor having its source terminal and bulk connected in common to said half program voltage source and its gate terminal connected to a common connection node of the drain terminals of said third PMOS transistor and third NMOS transistor; and a fourth NMOS transistor having its drain terminal connected to a drain terminal of said fourth PMOS transistor, its gate terminal connected to said common connection node and its source terminal and bulk connected in common to said ground voltage source, said drain terminals of said fourth PMOS transistor and fourth NMOS transistor being connected in common to an output terminal of said vertical voltage supply circuit; and wherein said first to third horizontal voltage supply circuits have the same construction.

\* \* \* \* \*